(12) United States Patent  
Bloom (10) Patent No.: US 8,249,127 B2  
(45) Date of Patent: Aug. 21, 2012

(54) OPTICAL SYSTEMS FOR LASER ARRAYS

(75) Inventor: David M Bloom, Jackson, WY (US)

(73) Assignee: Alces Technology, Inc., Jackson, WY (US)

( * ) Notice: Subject to any disclaimer, the term of this patent is extended or adjusted under 35 U.S.C. 154(b) by 0 days.

(21) Appl. No.: 13/347,580

(22) Filed: Jan. 10, 2012

(65) Prior Publication Data

US 2012/0106580 A1    May 3, 2012

Related U.S. Application Data

(62) Division of application No. 12/580,475, filed on Oct. 16, 2009, now Pat. No. 8,121,171, which is a division of application No. 11/732,984, filed on Apr. 4, 2007, now Pat. No. 7,623,558.

(51) Int. Cl.  
*H01S 3/08* (2006.01)

(52) U.S. Cl. .............. 372/101; 372/22; 372/21; 372/99; 372/98; 372/50.124

(58) Field of Classification Search ............. 372/22, 372/21, 99, 98, 101, 50.124  
See application file for complete search history.

(56) References Cited

U.S. PATENT DOCUMENTS

| | | | |
|---|---|---|---|
| 4,907,235 A | 3/1990 | Kuizenga | |
| 5,517,525 A | 5/1996 | Endo et al. | |
| 6,115,402 A * | 9/2000 | Caprara | 372/101 |
| 7,359,420 B2 | 4/2008 | Shchegrov et al. | |
| 2005/0018743 A1 | 1/2005 | Volodin et al. | |
| 2005/0281308 A1 | 12/2005 | Kim | |
| 2006/0023757 A1 | 2/2006 | Mooradian et al. | |
| 2007/0153862 A1 * | 7/2007 | Shchegrov et al. | 372/50.124 |

OTHER PUBLICATIONS

Watson, JP et al, "Laser sources at 460 nm based on intracavity doubling of extended cavity surface emitting lasers", Proc. SPIE, vol. 5364, p. 116-121 (2004).  
A. Mooradian et al., "High Power Extended Vertical Cavity Surface Emitting Diode Lasers and Arrays and Their Applications", Micro-Optics Conference, Tokyo, Japan, Nov. 2, 2005.  
International search report and written opinion of the international searching authority, PCT/US2008/058310, Mar. 24, 2009.  
Shchegrov, et al., "Development of compact blue-green lasers for projection display based on Novalux extended-cavity surface emitting laser technology", Proceedings of SPIE(2005).

* cited by examiner

*Primary Examiner* — Kinam Park  
(74) *Attorney, Agent, or Firm* — NUPAT, LLC; Morrison Ulman (57) ABSTRACT

Surface emitting laser arrays with intra-cavity harmonic generation are coupled to an optical system that extracts harmonic light in both directions from an intra-cavity nonlinear optical material in such a way that the focusing properties of the light beams are matched.

8 Claims, 9 Drawing Sheets

OPTICAL SYSTEMS FOR LASER ARRAYS

RELATED APPLICATIONS

This application is a division of U.S. patent application Ser. No. 12/580,475 filed on Oct. 16, 2009, which is a division of U.S. patent application Ser. No. 11/732,984 filed on 4 Apr. 2007, now U.S. Pat. No. 7,623,558, all of which are incorporated herein by reference.

TECHNICAL FIELD

The disclosure is generally related to laser arrays. In particular it is related to optical systems for efficiently focusing harmonic light emitted from a laser array.

BACKGROUND

Laser arrays are promising light sources for a number of applications such as projection displays and specialty lighting. Compared to lamps or light emitting diodes, for example, diode laser arrays offer tremendously increased brightness with long life and high reliability. Light generated by laser arrays can have high enough brightness to take advantage of nonlinear optical processes that convert light from one wavelength to another. For example, second harmonic generation (also called "frequency doubling") is a nonlinear optical process by which light at infrared wavelengths can be converted to visible wavelengths.

One way to make visible light is to focus a high intensity infrared laser beam onto a suitable nonlinear optical material as first demonstrated in 1961 by Franken. More recently scientists have shown that second harmonic light may be generated by placing a nonlinear material inside a laser cavity; i.e. between two mirrors that form the ends of a laser. Second harmonic generation inside a laser offers higher conversion efficiency than can be achieved externally. An example of a device using this approach is the Novalux, Inc. (Sunnyvale, Calif.) Novalux Extended Cavity Surface Emitting Laser (NECSEL) array that produces light at red, green and blue wavelengths via intra-cavity second harmonic generation.

Surface emitting diode lasers emit light perpendicular to the surface of the semiconductor substrate on which they are fabricated. The laser structure includes a high reflector built on the substrate. An optical gain section is built between the high reflector and an output coupler. When the laser is designed for intra-cavity harmonic generation the output coupler is made to be a high reflector at the fundamental frequency and transparent at the harmonic frequency.

Consider the situation in which second harmonic light is generated inside a diode laser cavity in a nonlinear optical material. The high reflector on the substrate is likely to be transparent at the second harmonic wavelength. Second harmonic light passing through the output coupler can be easily directed to the application at hand. Second harmonic light passing through the substrate high reflector, however, is lost to absorption in the semiconductor substrate.

Second harmonic light traveling toward the substrate high reflector can be saved by inserting a dichroic beam splitter in the laser cavity. A dichroic beam splitter reflects light at the second harmonic wavelength while transmitting light at the fundamental laser wavelength. Mirrors external to the laser cavity may be used to direct the second harmonic light in any direction, including quite usefully, parallel to the second harmonic light that passed through the laser output coupler. In this way as much visible light as possible may be extracted from an infrared diode laser array featuring intra-cavity second harmonic generation.

Although the method of extracting second harmonic light from a diode laser cavity through an output coupler in one direction and a dichroic beam splitter in the opposite direction is effective in terms of total light power recovered, it may not be optimum when beam focusing is considered. Light from the two sources is focused at different planes when both are focused by a single lens. The difficulty comes from the two different path lengths traveled by second harmonic light from its waist inside the laser cavity. Depending upon how external mirrors are arranged, the path via the output coupler to a focusing lens may be shorter than the path via the dichroic beam splitter.

Surface emitting diode laser arrays with intra-cavity second harmonic generation would benefit from an optical system that not only extracted second harmonic light in both directions from the intra-cavity nonlinear optical material, but did so in such a way that the focusing properties of both light beams were matched.

BRIEF DESCRIPTION OF THE DRAWINGS

The drawings are heuristic for clarity.

FIGS. 4A and B show an extended vertical cavity surface emitting diode laser with a dichroic beam splitter to extract second harmonic light.

DETAILED DESCRIPTION

Arrays of light emitters, such as diode laser arrays, are useful as light sources for projection displays. For example, Novalux, Inc. (Sunnyvale, Calif.) NECSEL arrays provide high brightness at red, green and blue wavelengths.

Figure 1:
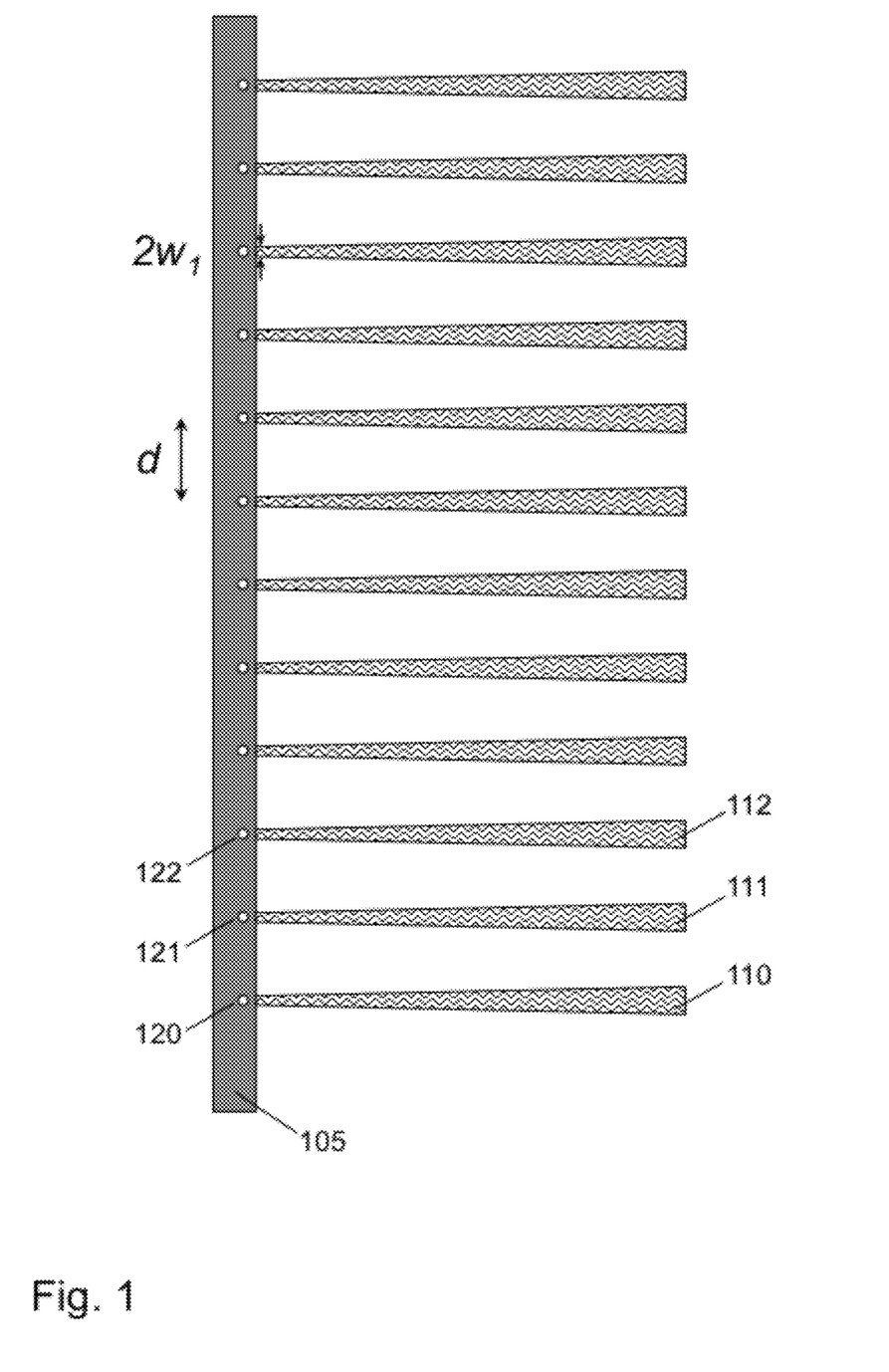
FIG. 1 shows a diode laser array with light beams propagating away from it in two perpendicular directions.

FIG. 1 shows a diode laser array with light beams propagating away from it in two perpendicular directions. In the figure, array 105 contains several diode lasers that radiate light beams such as light beams 110, 111, 112, etc, and 120, 121, 122, etc. Each pair of light beams, e.g. 110 and 120, is generated by a single external cavity diode laser. Beams 110, 111, 112, etc are emitted through their respective diode laser's output couplers. Beams 120, 121, 122, etc, on the other hand, are coupled out of their respective diode laser's cavities by a dichroic beam splitter which is not shown in the figure. Beams 120, 121, 122, etc, propagate out of the page, toward the reader.

The diode lasers are spaced apart by distance, d, and the $1/e^2$ diameter of the waist of each light beam is equal to $2w_1$. In a typical array 24 NECSELs are spaced apart by d~350 microns and each laser emits a Gaussian beam with a waist diameter of approximately 70 microns. Neither the number of emitters nor the spacing nor the beam diameter is of particular importance here. The light beams diverge as they propagate. The divergence angle is a function of the beam waist and the wavelength of the light.

A diode laser array such as the one shown schematically in FIG. 1 may be used as a light source for a projection display. In a display system, light from a light source is formed into an image by a light modulator. The brightness of the displayed image depends in part on how efficiently light from the light source illuminates the modulator. For example, if light from the light source is improperly focused on the modulator, or never reaches the modulator, then the displayed image will not be as bright as it otherwise might be. The diode laser array of FIG. 1 could be improved for display applications if light beams 120, 121, 122, etc, were redirected so that they propagated between, parallel to, in the same plane, and with the same divergence as, light beams 110, 111, 112, etc. This scenario is illustrated in FIG. 2.

Figure 2:
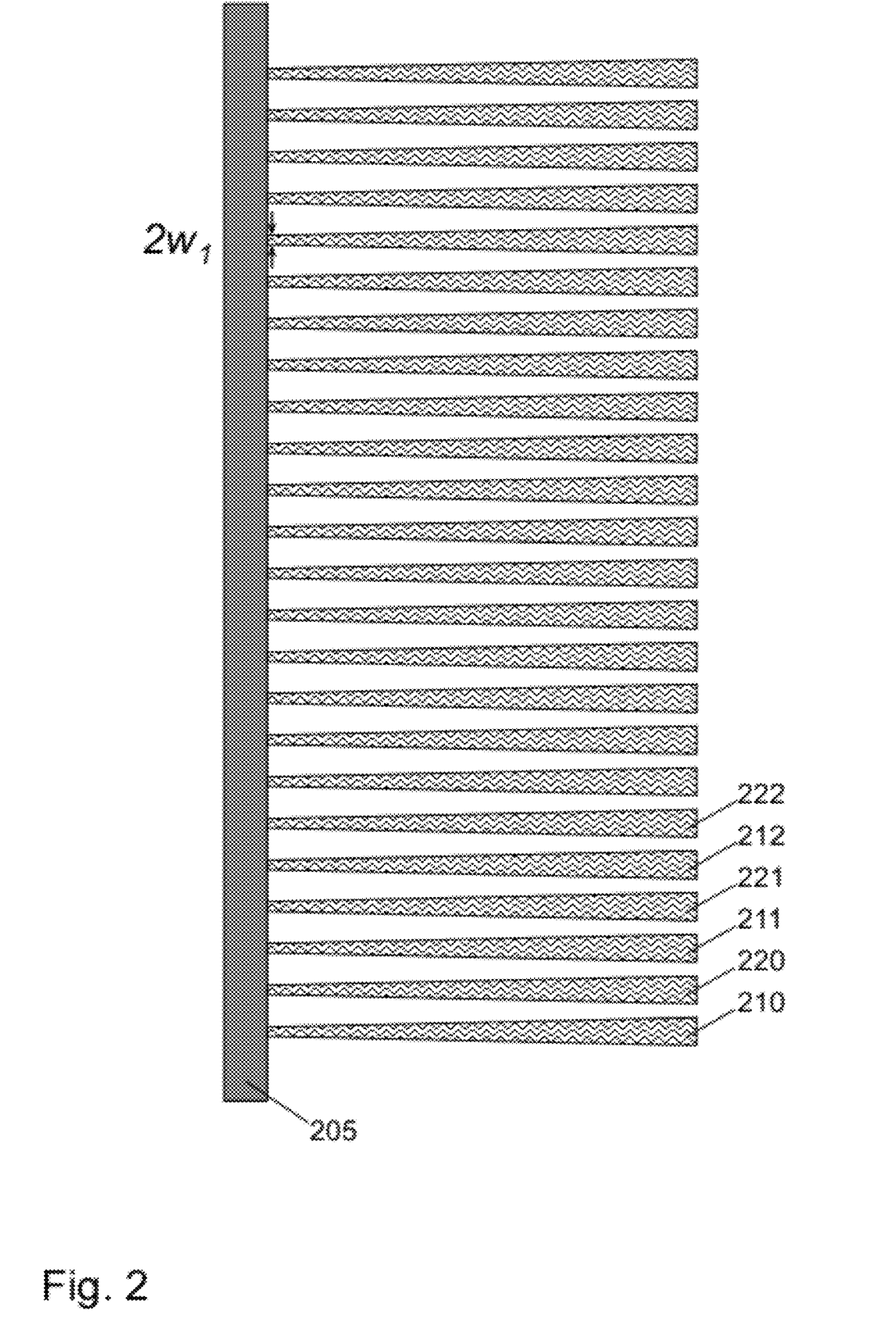
FIG. 2 shows a diode laser array with light beams propagating away from it in one direction.

FIG. 2 shows a diode laser array with light beams propagating away from it in one direction. In the figure, array 205 contains several diode lasers that radiate light beams such as light beams 210, 211, 212, etc, and 220, 221, 222, etc. Beams 210, 211, 212, etc are emitted through their respective diode laser's output couplers. Beams 220, 221, 222, etc, on the other hand, are coupled out of their respective diode laser's cavities by a dichroic beam splitter which is not shown in the figure. Beams 220, 221, 222, etc, are directed into their respective positions between, parallel to, and in the same plane as light beams 110, 111, 112, etc, by optical components that are not shown in FIG. 2, but are discussed below. Furthermore light beams 220, 221, 222, etc, have been manipulated so that their divergence matches that of light beams 210, 211, 212, etc. That way all of the light beams from the diode laser array can be focused by a lens to a waist lying in one plane.

Figure 3:
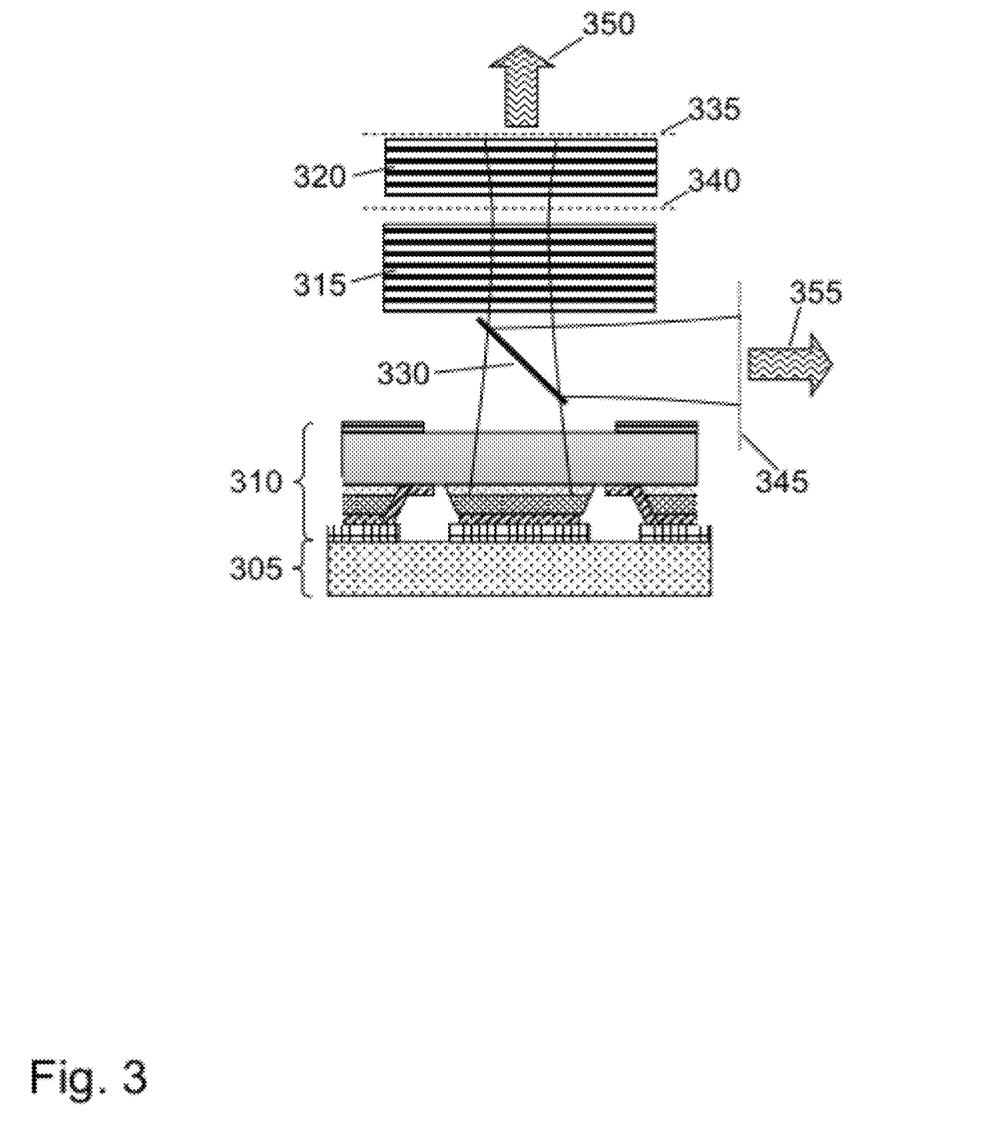
FIG. 3 shows the structure of an extended vertical cavity surface emitting diode laser with an intra-cavity second harmonic generation section.

FIG. 3 shows the structure of an extended vertical cavity, surface emitting diode laser with an intra-cavity second harmonic generation section. In the figure, a gain section and high reflecting mirror are fabricated in semiconductor process layers 310 on a substrate 305. Nonlinear optical structure 315 and output coupler 320 are placed so that a laser cavity is formed with the nonlinear optical structure 315 lying within the cavity. Nonlinear optical structure 315 may be made from, for example, a nonlinear optical crystal or an engineered nonlinear optical material such as periodically poled lithium niobate. Dichroic beam splitter 330 reflects second harmonic light (e.g. visible wavelengths) generated in nonlinear optical structure 315 forming light beam 355. Dichroic beam splitter 330 transmits light at the fundamental laser wavelength (e.g. infrared). Light beam 350 represents second harmonic light that passes through output coupler 320.

Dotted lines 335, 340 and 345 represent reference planes used in discussion herein. In particular reference plane 340 marks the location of the waist of light beams 350 and 355. In practice the waist may not be located exactly as drawn in the figure; however, the waist lies inside the laser cavity and its location can be measured or calculated from laser cavity parameters. Reference plane 335 represents an output face of the diode laser in the direction defined by light beam 350 while reference plane 345 represents an output face of the diode laser in the direction defined by light beam 355.

Figure 4:
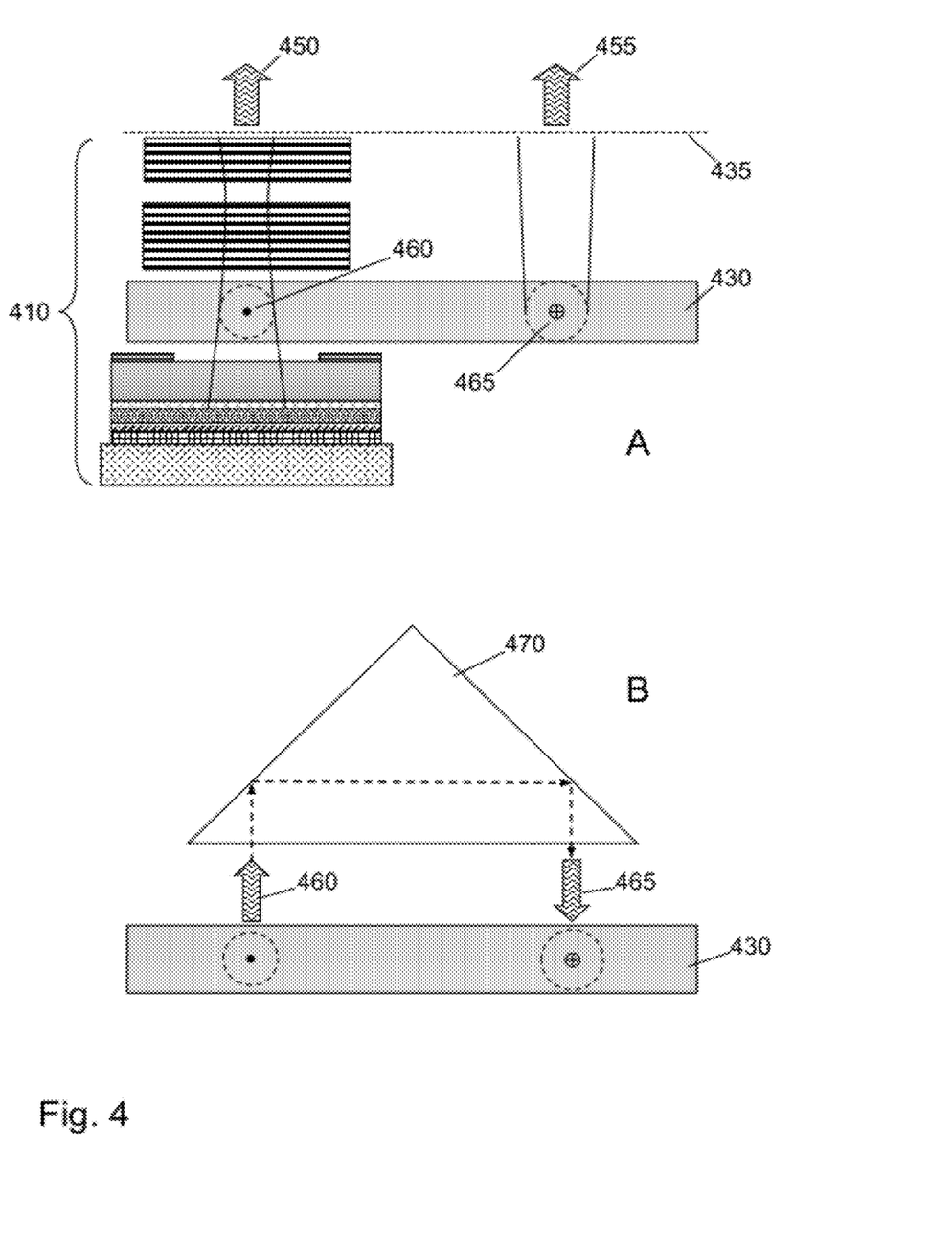

FIGS. 4A and B show an extended vertical cavity surface emitting diode laser with a dichroic beam splitter to extract second harmonic light. In FIG. 4A diode laser 410 is the same as the diode laser of FIG. 3 as seen from a vantage point in the plane of FIG. 3 and looking perpendicular to the direction of propagation of laser beam 350. In FIG. 4A, dichroic beam splitter 430 (corresponding to dichroic beam splitter 330 in FIG. 3) is shown extended beyond diode laser 410. The function of beam splitter 430 could be achieved by two smaller beam splitters as its beam splitting properties are only needed in places where light beams are incident upon it. Arrow, dot and cross 455, 460 and 465 respectively all refer to a beam of second harmonic light extracted from the cavity of diode laser 410. This beam corresponds to light beam 355 in FIG. 3 as it is reflected in various directions. In particular FIG. 4B shows schematically how light beam 460 is reflected in direction 465 by retro reflector 470. Dotted line 435 represents a reference plane used in discussion herein.

In FIG. 4B retro reflector 470 directs light beam 460 back toward beam splitter 430 which in turn directs the beam in direction 455. The view of FIG. 4B is one in the plane of FIG. 4A and looking parallel to beams 450 and 455. It can be seen by comparison to FIGS. 1 and 2 that retro-reflector 470, in combination with beam splitter 430, partially achieves the result shown in FIG. 2: two second harmonic light beams parallel to one another and in the same plane with beams from other diode lasers in an array.

The result is only partially achieved because light beams 450 and 455 are not the same size at plane 435. Both beams diverge from a waist inside diode laser 410, but beam 455 has traveled farther by the time it reaches plane 435. These two beams cannot conveniently be focused to a common waist by a single lens. In some cases, for example if the Rayleigh range is long compared to the extra distance traveled by beam 455, the system shown in FIGS. 4 and 5 may be sufficient.

Figure 5:
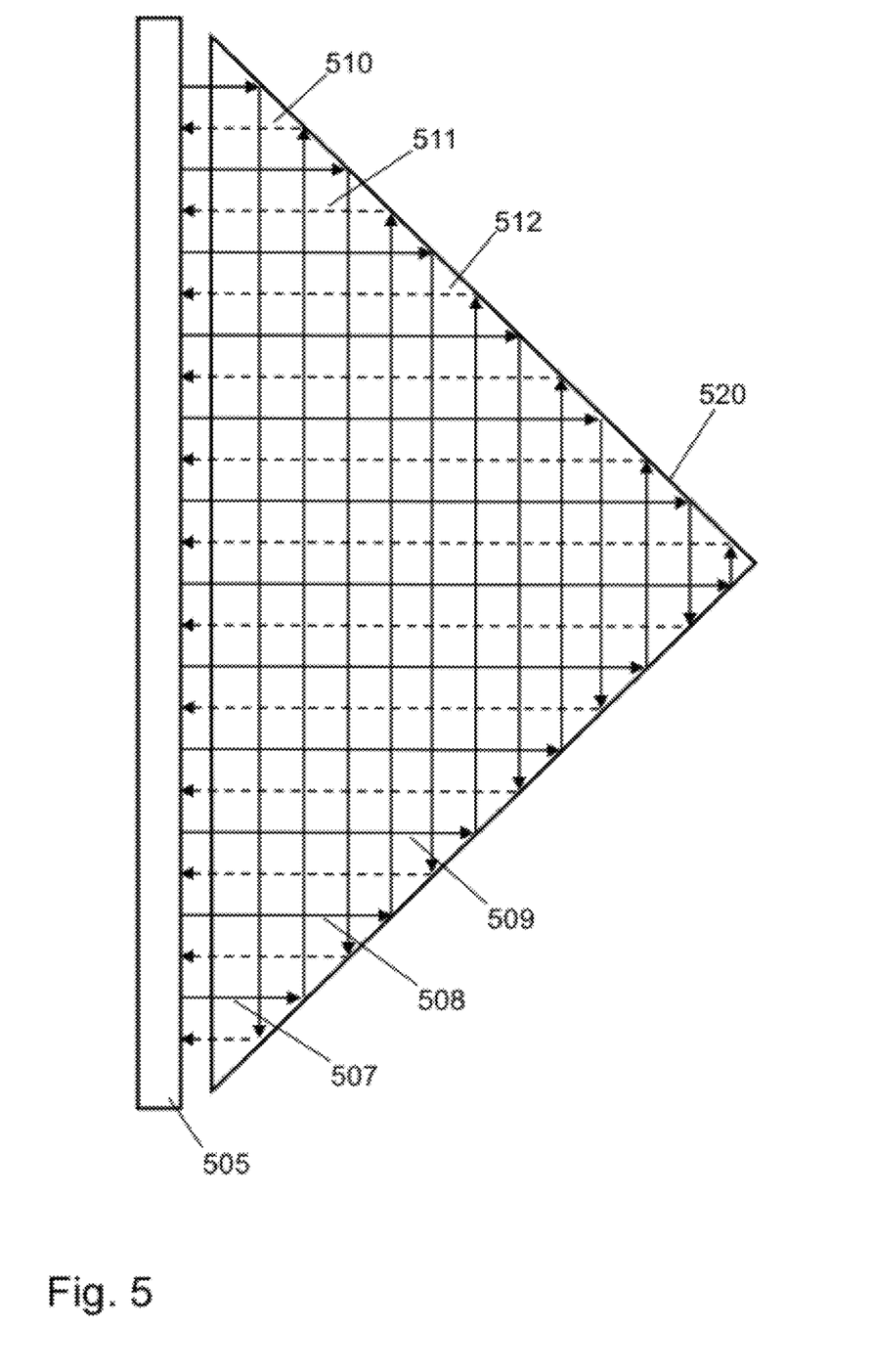
FIG. 5 shows a light emitter array and a retro-reflector.

FIG. 5 shows a light emitter array and a retro-reflector. In the figure light beams 507, 508, 509, etc, drawn as solid lines radiate from array 505. Retro reflector 520 redirects the beams back toward array 505 as beams 510, 511, 512, etc. These beams, drawn as dotted lines, are interleaved approximately half way between the beams radiating away from the array. FIG. 5 represents a generalization of the arrangement shown in FIG. 4B from two beams to several beams. As in FIG. 4 the retro reflected beams diverge over the distance they travel to and from the retro reflector. In some cases, this may represent an adequate solution while in others additional optics to control beam divergence may be required.

Figure 6:
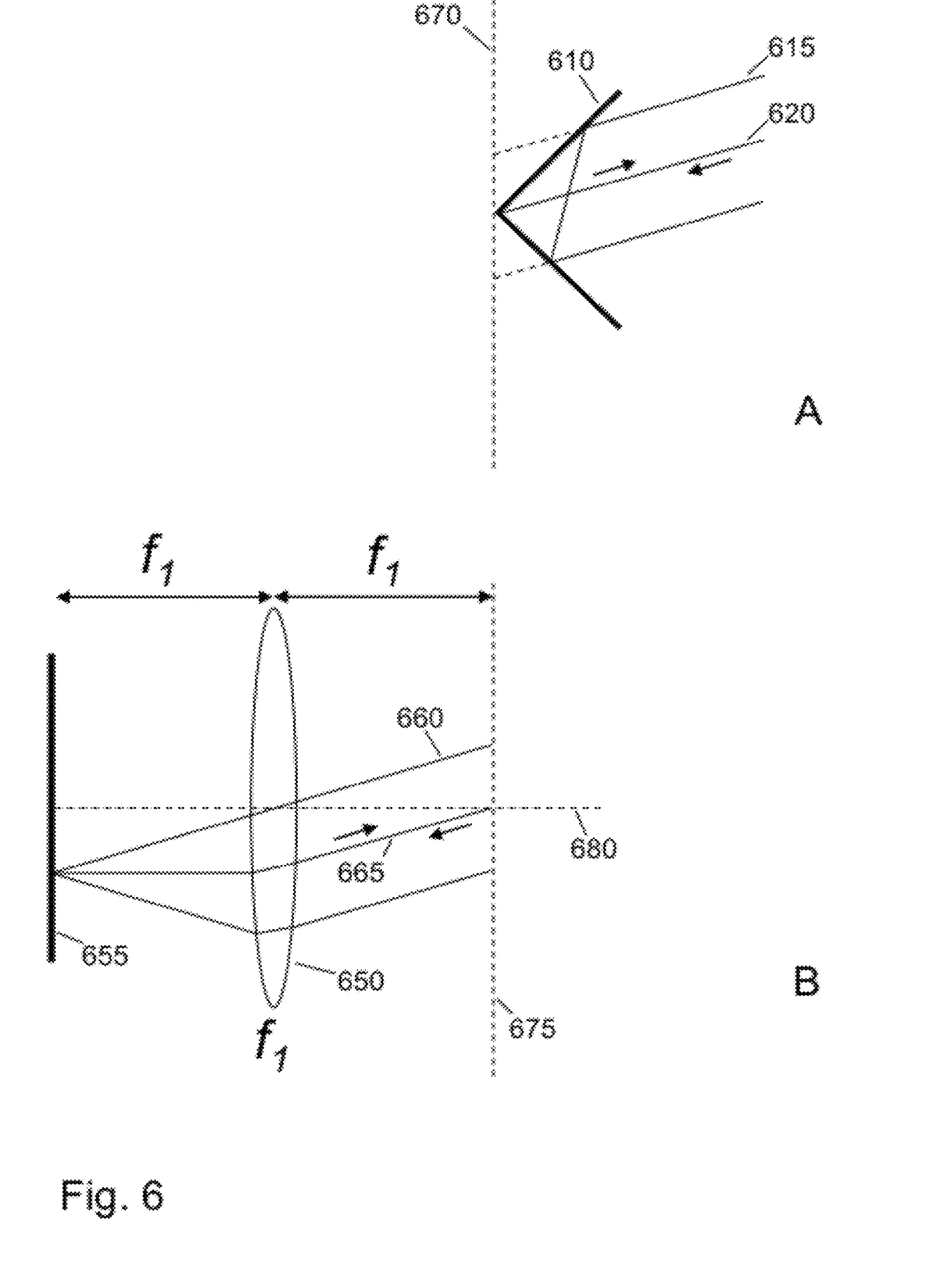
FIG. 6 shows a two different ways to realize a retro-reflecting optical element.

Conceptually, what is needed is a way to place a retro reflector at the waist of the second harmonic light beam in an external cavity diode laser. In practice, this may be accomplished by using a lens and a mirror to form a virtual retro reflector. FIG. 6 shows a two different ways to realize a retro-reflecting optical element.

FIG. 6A shows retro reflector 610 with light rays 615 and 620 incident upon it. Retro reflector 610 may be realized as a cube corner reflector, roof prism or similar element with plane reflecting surfaces. Looking at a retro reflector one sees not one's mirror image, but rather one's image as seen in a photograph. Put another way light rays incident upon retro reflector 610 are returned as if folded back at reference plane 670. If a Gaussian beam is focused on retro reflector 670 so that the beam waist lies in plane 670, the return beam will diverge such that it overlaps the incoming beam exactly for all distances away from the reference plane. The retro reflecting properties of 610 exist for light beams arriving at a range of angles away from (and including) the normal to plane 670.

FIG. 6B shows an alternative to retro reflector 610. In FIG. 6B light rays 660 and 665 are incident upon lens 650. Lens 650 is placed one focal length away from mirror 655. Dotted line 680 lies on the symmetry axis of lens 650. Dotted line 675 is a reference plane perpendicular to axis 680 and located one focal length away from lens 650 on the opposite side of the lens from mirror 655. Light rays 660 and 665 are retro reflected at plane 675 by the combination of lens 650 and mirror 655. If a Gaussian beam is focused to a waist at plane 675 the return beam will diverge such that it overlaps the incoming beam exactly for all distances away from the reference plane. It can be seen that the lens and mirror system provides the same retro reflecting characteristic as the cube corner reflector with one important difference: there is no physical structure at reference plane 675 of the lens and mirror system. Therefore the lens and mirror system of FIG. 6B can be used to, in effect, place a retro reflector at the waist of the second harmonic light beam in an external cavity diode laser.

Figure 7:
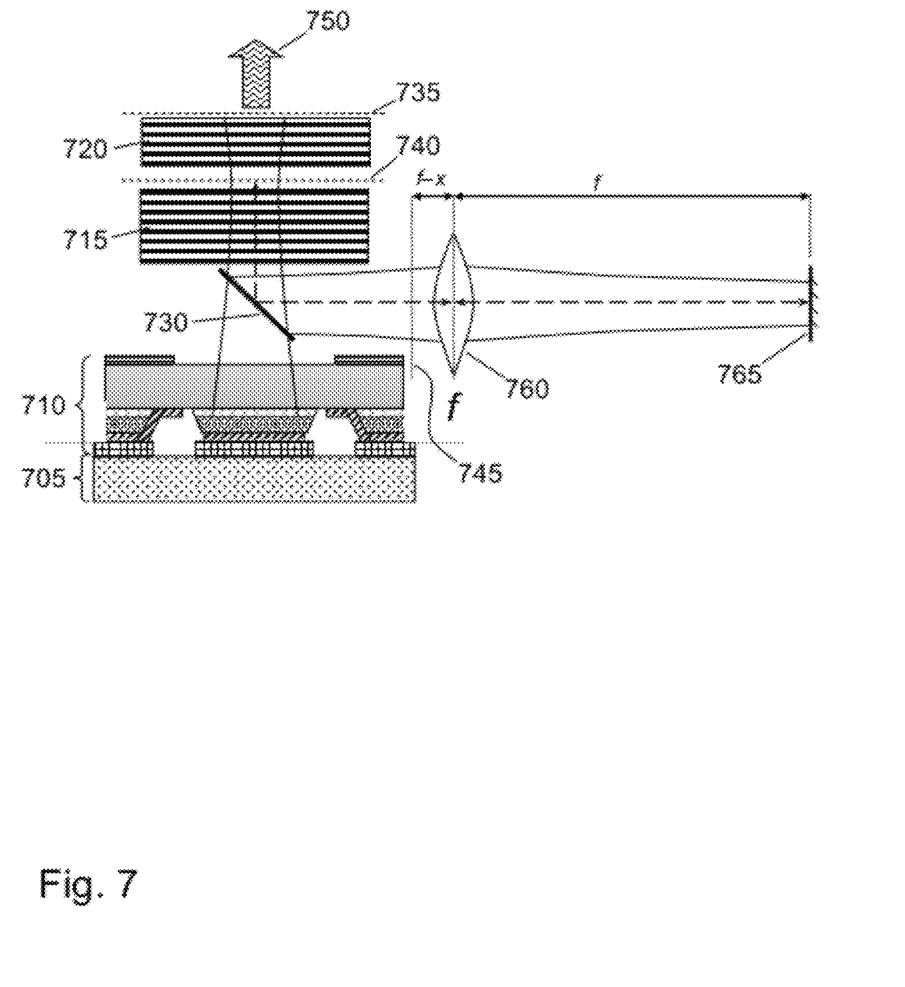
FIG. 7 shows an extended vertical cavity surface emitting diode laser with a dichroic beam splitter and an external lens and mirror.

FIG. 7 shows an extended vertical cavity surface emitting diode laser with a dichroic beam splitter and an external lens and mirror. The system illustrated in FIG. 7 is similar to that shown in FIG. 3 with the addition of an external lens and mirror. The system shown in FIG. 7 effectively retro reflects a second harmonic light beam that has been coupled out of a diode laser cavity by a beam splitter back through the cavity. The waist of the retro reflected beam coincides with the waist of a second harmonic light beam that propagates from a nonlinear optical section toward an output coupler. The divergences of the two second harmonic light beams are therefore matched.

In the figure, a gain section and high reflecting mirror are fabricated in semiconductor process layers 710 on a substrate 705. Nonlinear optical structure 715 and output coupler 720 are placed so that a laser cavity is formed with the nonlinear optical structure 715 lying within the cavity. Nonlinear optical structure 715 may be, for example, a periodically poled lithium niobate structure, a nonlinear optical crystal or an engineered nonlinear optical material. Dichroic beam splitter 730 reflects second harmonic light (e.g. visible wavelengths) generated in nonlinear optical structure 715 toward lens 760. Dichroic beam splitter 730 transmits light at the fundamental laser wavelength (e.g. infrared). Light beam 750 represents second harmonic light that passes through output coupler 720.

Dotted lines 735, 740 and 745 represent reference planes used in discussion herein. In particular reference plane 740 marks the location of the waist of light beam 750. Reference plane 735 represents the output surface of a diode laser array while reference plane 745 represents a side surface of the array. It is difficult or impossible to place a bulk optical component closer to the diode laser than reference planes 735 or 745.

Lens 760 is placed near the diode laser such that the optical path distance from the lens to waist reference plane 740 is one focal length. This distance is the sum of the distance from the lens to beam splitter 730 and the distance from the beam splitter to waist reference plane 740. Mirror 765 is placed one focal length away from lens 760 on the opposite side of the lens from the diode laser. The distance from the lens to reference plane 745 is denoted "f−x" in the figure to show that it is less than one focal length.

It can be seen by comparison of FIGS. 7 and 6B that lens 760 and mirror 765 are placed in the retro reflective arrangement of FIG. 6B. Reference plane 675 in FIG. 6 corresponds to waist reference plane 740 in FIG. 7. In FIG. 7, lens 760 is illustrated as having its axis coincident with the axis of a light beam coupled out of the laser cavity by a dichroic beam splitter. However, lens 760 may also be displaced perpendicular to the light beam, for example in a direction perpendicular to the plane of the figure. In this way the return light beam can be made parallel to light beam 750 rather than coincident with it.

Figure 8:
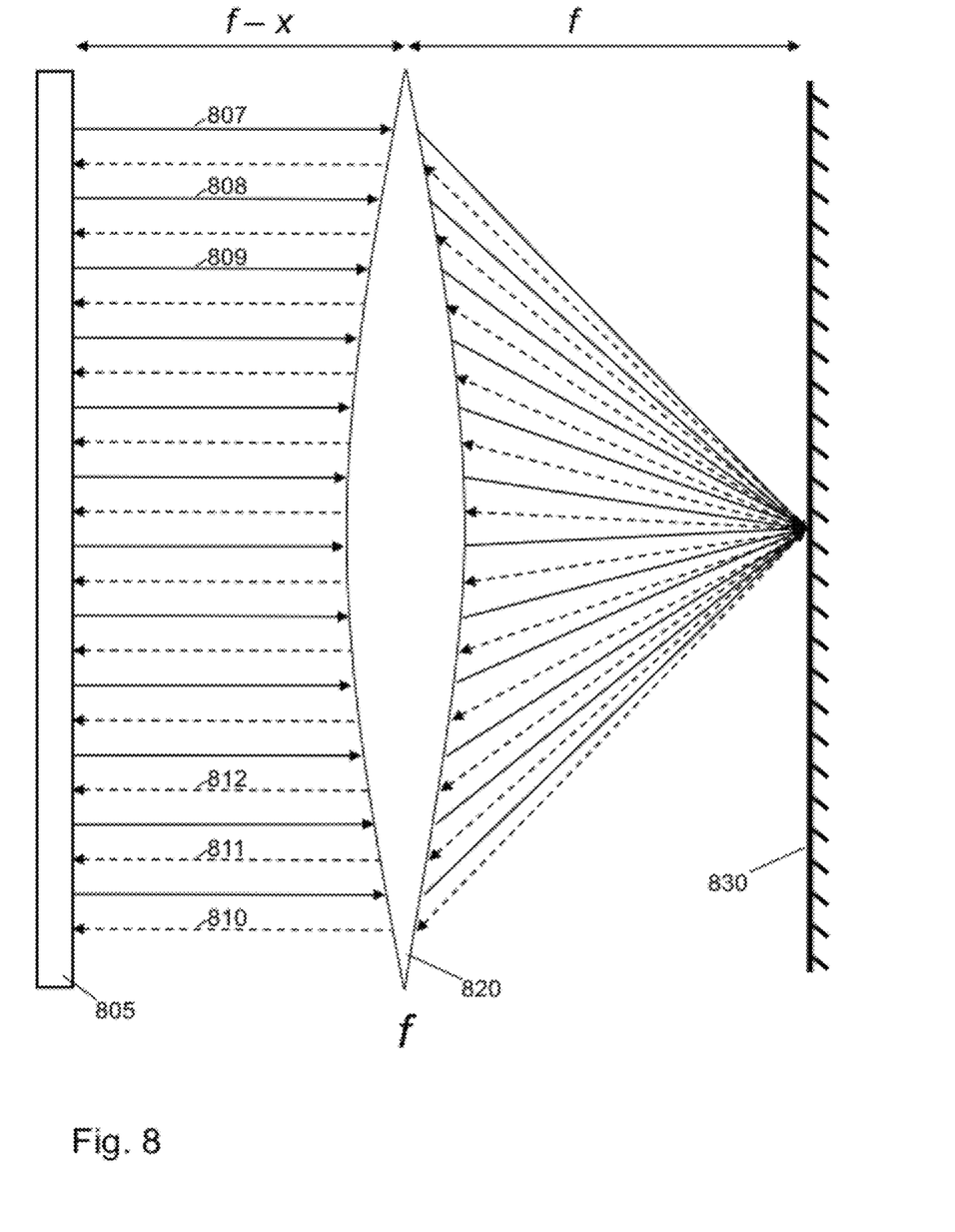
FIG. 8 shows a lens and mirror with a light emitter array.

The virtual retro reflector of FIG. 6B may be applied to an array of diode lasers of the type illustrated in FIGS. 3 and 7. FIG. 8 shows a lens and mirror with a light emitter array. The system illustrated in FIG. 8 combines the virtual retro reflector properties illustrated in FIGS. 6B and 7 with the interleaving of light beams illustrated in FIG. 5.

FIG. 8 shows a light emitter array and a lens and mirror combination acting as a virtual retro-reflector. In the figure light beams 807, 808, 809, etc, drawn as solid lines radiating from array 805. Lens 820 and mirror 830 redirect the beams back toward array 805 as beams 810, 811, 812, etc. These beams, drawn as dotted lines, are interleaved approximately half way between the beams radiating away from the array. FIG. 8 represents a generalization of the arrangement shown in FIG. 7 from one diode laser to an array of many such lasers. Mirror 830 is placed one focal length away from lens 820 on the opposite side of the lens from array 805. Lens 820 is placed a distance f−x away from the side surface of array 805. (The side surface of array 805 is analogous to reference plane 745 in FIG. 7 which represents the side surface of a diode laser.) The distance from lens 820 to the plane containing the desired location of retro reflected beam waists (analogous to reference plane 740 in FIG. 7) is the focal length of the lens. Matched second harmonic beams in the system of FIG. 8 are radiated in a direction perpendicular to the plane of the page.

The system of FIGS. 7 and 8 extracts second harmonic light radiated in both directions from the intra-cavity nonlinear optical material in a NECSEL or similar structure and it does so in such a way that the focusing properties of both light beams are matched. Furthermore, the difference in path length traveled between light that goes directly to an output coupler and light that traverses the lens-mirror virtual retro reflector is helpful for speckle reduction in display applications.

Figure 9:
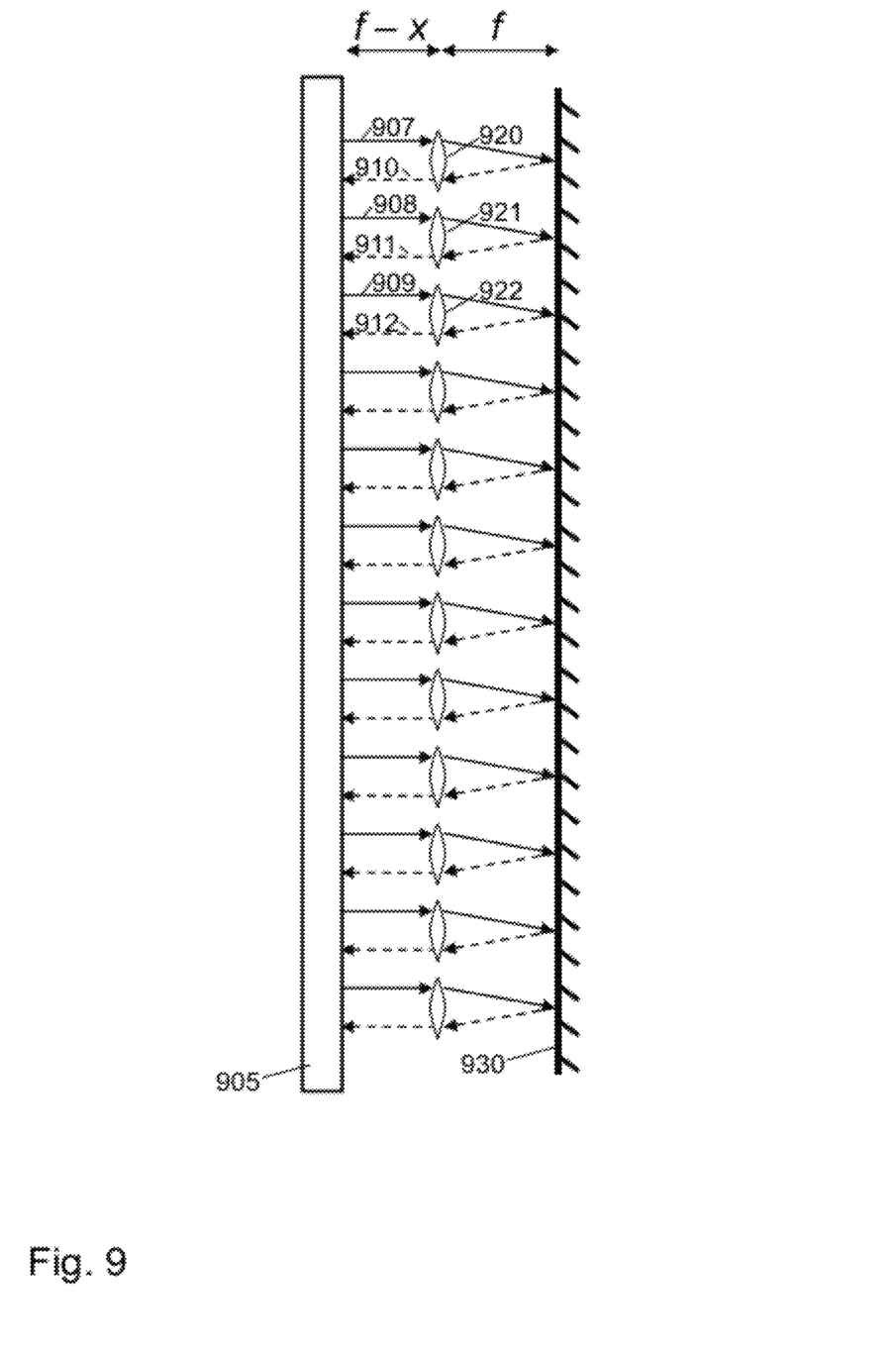
FIG. 9 shows an array of lenses and a mirror with a light emitter array.

FIG. 9 shows an array of lenses and a mirror with a light emitter array. This system represents an alternative embodiment of the same principles applied in FIG. 8. In FIG. 9 light beams 907, 908, 909, etc, drawn as solid lines radiating from array 905. Lenses 920, 921, 922, etc, and mirror 930 redirect the beams back toward array 905 as beams 910, 911, 912, etc. These beams, drawn as dotted lines, are interleaved approximately half way between the beams radiating away from the array. FIG. 9 represents a generalization of the arrangement shown in FIG. 7 from one diode laser to an array of many such lasers. Mirror 930 is placed one focal length away from lenses 920, 921, 922, etc, on the opposite side of the lenses from array 905. Lenses 920, 921, 922, etc, are placed a distance f−x away from the side surface of array 905. (The side surface of array 905 is analogous to reference plane 745 in FIG. 7 which represents the side surface of a diode laser.) The distance from lenses 920, 921, 922, etc, to the plane containing the desired location of retro reflected beam waists (analogous to reference plane 740 in FIG. 7) is the focal length of the lenses. Matched second harmonic beams in the system of FIG. 9 are radiated in a direction perpendicular to the plane of the page.

The optical systems disclosed herein offer efficient light extraction from diode laser arrays for display applications. Second harmonic light generated in both directions from an intra-cavity nonlinear optical material is recovered by a virtual retro reflector so that the focusing properties of the light are optimized. Further, speckle is reduced by retro reflected path lengths that may be longer than the coherence length of diode lasers in an array.

All of the optical systems disclosed herein also apply to arrays of lasers that are not diode lasers. For example, an array of optically pumped lasers would benefit from the optical systems described herein in the same way that diode lasers do.

Furthermore, it is unnecessary for the harmonic light generated in the laser cavities to be second harmonic light. All of the optical systems described herein apply equally to other harmonics or light produced by sum frequency generation, difference frequency generation, optical parametric oscillators, four-wave mixing, and/or other nonlinear optical processes. The method of producing gain and the frequency of the light created in a nonlinear process may be selected to suit a particular application.

As one skilled in the art will readily appreciate from the disclosure of the embodiments herein, processes, machines, manufacture, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, means, methods, or steps.

The above description of illustrated embodiments of the systems and methods is not intended to be exhaustive or to limit the systems and methods to the precise form disclosed. While specific embodiments of, and examples for, the systems and methods are described herein for illustrative purposes, various equivalent modifications are possible within the scope of the systems and methods, as those skilled in the relevant art will recognize. The teachings of the systems and methods provided herein can be applied to other systems and methods, not only for the systems and methods described above.

In general, in the following claims, the terms used should not be construed to limit the systems and methods to the specific embodiments disclosed in the specification and the claims, but should be construed to include all systems that operate under the claims. Accordingly, the systems and methods are not limited by the disclosure, but instead the scope of the systems and methods are to be determined entirely by the claims.

What is claimed is:

1. An optical system comprising:
   an array of lasers from which harmonic light beams are coupled by an intra-cavity dichroic beam splitter;
   a lens placed one focal length away from the waists of the harmonic light beams; and,
   a mirror placed one focal length away from the lens on the opposite side of the lens from the waists.

2. The system of claim 1 wherein the lens and the mirror redirect the harmonic light beams coupled by the intra-cavity dichroic beam splitter so that the light beams propagate parallel to, in the same plane as, and with the same divergence as, harmonic light beams coupled from the lasers by the lasers' output couplers.

3. The system of claim 1 wherein the lens and the mirror form a virtual retro reflector at the waist of the harmonic light beam.

4. The system of claim 1 wherein the lasers are diode lasers.

5. The system of claim 4 wherein the diode lasers are extended vertical cavity surface emitting diode lasers.

6. The system of claim 1 wherein the harmonic light beams are second harmonic light beams.

7. The system of claim 1 wherein the harmonic light beams are generated within an engineered nonlinear optical material within the cavities of the lasers.

8. The system of claim 7 wherein the engineered nonlinear optical material is periodically poled lithium niobate.

\* \* \* \* \*